(12) United States Patent
Takada

(10) Patent No.: US 9,570,378 B2
(45) Date of Patent: Feb. 14, 2017

(54) SEMICONDUCTOR DEVICE INCLUDING DUMMY PATTERN

(71) Applicant: PS4 LUXCO S.A.R.L., Luxembourg (LU)

(72) Inventor: Yorio Takada, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/283,050

(22) Filed: May 20, 2014

(65) Prior Publication Data
US 2014/0246780 A1  Sep. 4, 2014

Related U.S. Application Data

(63) Continuation of application No. 12/213,371, filed on Jun. 18, 2008, now Pat. No. 8,756,560.

(30) Foreign Application Priority Data

Jun. 20, 2007 (JP) .................. 2007-162437

(51) Int. Cl.
| | | |
|---|---|---|
| G06F 17/50 | (2006.01) | |
| H01L 23/49 | (2006.01) | |
| H01L 21/321 | (2006.01) | |
| H01L 21/768 | (2006.01) | |
| H01L 23/522 | (2006.01) | |
| H01L 27/02 | (2006.01) | |
| H01L 23/00 | (2006.01) | |

(52) U.S. Cl.
CPC ........... *H01L 23/49* (2013.01); *H01L 21/3212* (2013.01); *H01L 21/7684* (2013.01); *H01L 23/522* (2013.01); *H01L 24/42* (2013.01); *H01L 27/0207* (2013.01); *H01L 2224/05599* (2013.01); *H01L 2224/85399* (2013.01); *H01L 2924/00014* (2013.01)

(58) Field of Classification Search
CPC ....................................................... G06F 17/50
USPC ........................................................ 716/139
See application file for complete search history.

(56) References Cited

U.S. PATENT DOCUMENTS

| | | |
|---|---|---|
| 5,948,573 A | 9/1999 | Takahashi |
| 6,261,883 B1 | 7/2001 | Koubuchi et al. |
| 6,553,274 B1 | 4/2003 | Motoyama et al. |
| 6,577,371 B2 | 6/2003 | Hirabayashi |
| 6,642,540 B2 | 11/2003 | Komurasaki et al. |
| 6,693,315 B2 | 2/2004 | Kuroda et al. |
| 7,411,302 B2 | 8/2008 | Kuroda et al. |
| 2002/0061608 A1 | 5/2002 | Kuroda et al. |
| 2004/0119134 A1* | 6/2004 | Goldberg .............. H01L 21/288 257/508 |

(Continued)

*Primary Examiner* — Thuan Do
(74) *Attorney, Agent, or Firm* — Kunzler Law Group, PC

(57) ABSTRACT

A semiconductor device includes a substrate including a circuit region, a dummy region, and a dummy clearance section surrounding the circuit region, and a plurality of dummy patterns formed in the dummy region, the plurality of dummy patterns comprising a first dummy pattern and a second dummy pattern, a distance between the first dummy pattern and the circuit region being less than a distance between the second dummy pattern and the circuit region, and a dummy pattern being absent between the first dummy pattern and the circuit region. The first dummy pattern includes an area which is greater than an area of the second dummy pattern.

10 Claims, 14 Drawing Sheets

(56) References Cited

U.S. PATENT DOCUMENTS

2007/0256039 A1* 11/2007 White ............................... 716/4

* cited by examiner

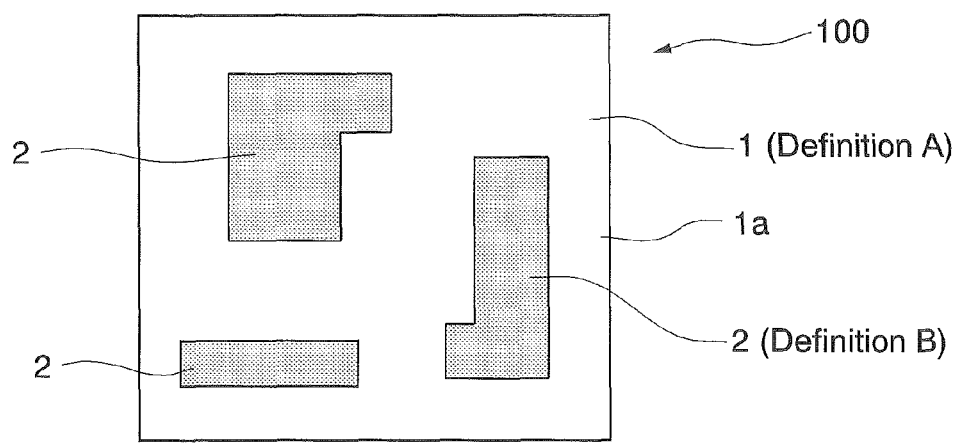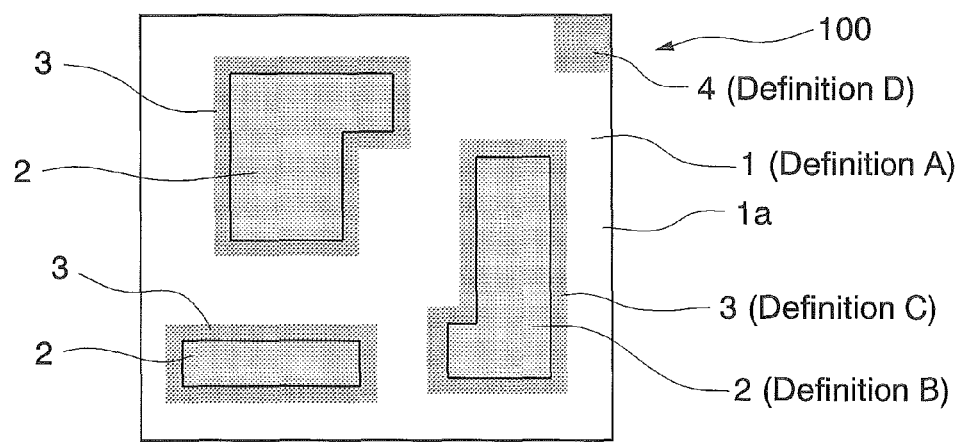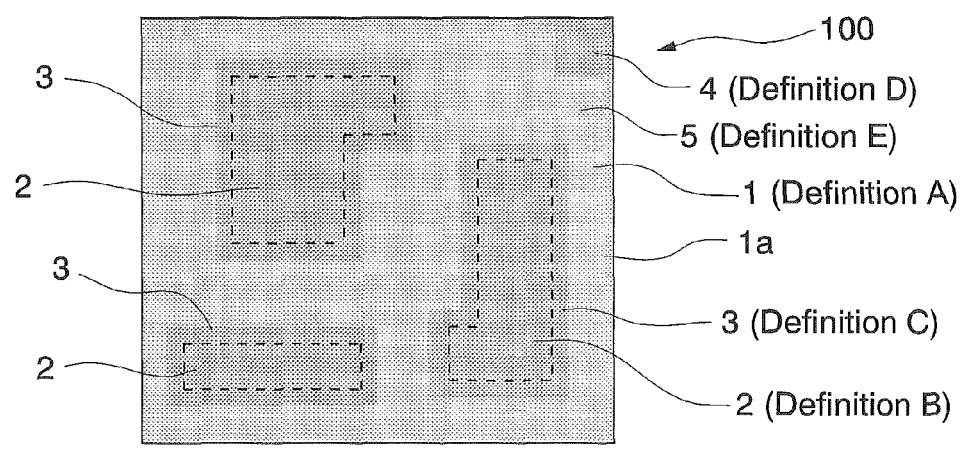

SEMICONDUCTOR DEVICE INCLUDING DUMMY PATTERN

CROSS-REFERENCE TO RELATED APPLICATIONS

This application is a Continuation application of U.S. patent application Ser. No. 12/213,371, filed on Jun. 18, 2008.

BACKGROUND OF THE INVENTION

Field of the Invention

The present invention relates to a method for designing a dummy pattern, an exposure mask, a semiconductor device, a method for manufacturing a semiconductor device, and a storage medium having a dummy pattern design program.

Priority is claimed on Japanese Patent Application No. 2007-162437, filed Jun. 20, 2007, the content of which is incorporated herein by reference.

Description of the Related Art

In recent years, the depth of focus used in lithographic methods in the development of semiconductor devices has been decreased due to developments in sub-micron technology, and thus it has become difficult to accurately form very small wiring patterns.

With the progress in multilayering techniques, unevenness of the surface of an interlayer insulating film has increased, it has thus become more difficult to form very small wiring patterns on the surface thereof.

To resolve the aforementioned problems, the surface of a semiconductor substrate is planarized using a chemical mechanical polishing (CMP) process.

This CMP process can eliminate unevenness over a narrow range, and at the same time, eliminate unevenness over a wide range, and can efficiently planarize a surface of a semiconductor substrate. Therefore, focusing in lithographic methods also became easy, and very small wiring patterns could be easily formed on a surface of a semiconductor substrate.

However, the CMP process sometimes gave rise to phenomena such as dishing and erosion and degraded the planarity of the surface of a semiconductor substrate onto which the CMP process has been performed.

Dishing and erosion refer to the phenomena of formation of a depression on a semiconductor substrate when the surface of the semiconductor substrate is polished by a pad used in the CMP process.

When an electrode made of copper (Cu), for example, is formed by an isolated wire of large diameter, since this Cu material is softer than the material of the insulating film, Cu tends to be removed easily because of deflection of the pad and the gouging effect of slurry, so the electrode section tends to be shaved off to a large depth locally. This phenomenon is called the dishing phenomenon.

Moreover, when an electrode made of Cu is formed by densely-disposed wires with small diameter, a thin insulating film is formed between the densely-disposed wires, and as a result, the densely-disposed wiring section can be removed easily. This densely-disposed wiring section tends to be removed to a large depth locally, and this phenomenon is called the erosion phenomenon.

The dishing and erosion phenomena form portions of large shaved-off depth and portions of small shaved-off depth on the surface of a semiconductor substrate by the CMP process and cause deterioration in the planarity of the surface of the semiconductor substrate.

Dishing and erosion are phenomena that occur because a substrate surface has isolated wires of large diameter or dense wires of small diameter. Therefore, if the wiring density on a substrate surface is made uniform, these phenomena can be inhibited.

If a pattern (hereafter referred to as a "dummy pattern") that is formed by the material with the same properties as those of the wiring material is formed in a region free from wiring on a surface of a semiconductor substrate, the wiring density on the surface of the semiconductor substrate can be made uniform, and as a result, the surface of the semiconductor substrate can be shaved off uniformly.

Here, the size and shape of the dummy pattern is important as well as the type of layout to be disposed.

Dummy formation methods for dummy pattern using the CMP process or automatic generating programs for dummy patterns and so on, are disclosed in the Japanese Unexamined Patent Application, First Publication No. H10-293391, the Japanese Unexamined Patent Application, First Publication No. 2001-166452, the Japanese Unexamined Patent Application, First Publication No. 2002-158278, and the Japanese Unexamined Patent Application, First Publication No. 2006-237440.

For instance, the Japanese Unexamined Patent Application, First Publication No. H10-293391, discloses a mask pattern design method for making a mask for forming a dummy pattern by dividing the surface of the semiconductor substrate by a mesh and designing a dummy pattern of optimum density and optimum shape.

The Japanese Unexamined Patent Application, First Publication No. 2001-166452 discloses an automatic design method for a dummy pattern with optimum disposition and optimum density by firstly dividing the dummy pattern into rectangular blocks and processing these blocks sequentially.

Moreover, the Japanese Unexamined Patent Application, First Publication No. 2002-158278 discloses a method for designing a dummy pattern for optimum disposition of a combination of large rectangular dummy patterns and small rectangular dummy patterns to suit the shape and size of the region in which the dummy patterns are formed.

Furthermore, the Japanese Unexamined Patent Application, First Publication No. 2006-237440 discloses a program for calculating optimum density and optimum disposition of a dummy pattern by sequentially replacing adjustment-dummy patterns until the area ratio calculated based on the area of the region on which the dummy patterns are formed and the area of the dummy patterns becomes an optimum value, so that as many dummy patterns as possible are disposed in a region in which dummy patterns are formed.

FIG. 13 is a flowchart illustrating an example of a typical design method for designing a conventional dummy pattern.

The conventional method for designing a dummy pattern includes the four steps mentioned below.

(1) Extracting a chip region and device graphics data
(2) Setting a clearance section and a dummy placement prohibition region
(3) Forming a rectangular dummy pattern (defined by a side of the rectangular dummy pattern and space)
(4) Removing an unnecessary definition section FIGS. 14 to 17 are plan views illustrating examples of the steps for designing the dummy pattern of an example of a conventional method for designing a dummy pattern based on this flowchart.

FIG. 14 illustrates the first step "Extracting a chip region and device graphics data". It is a schematic plan view illustrating an example of disposition of a layout of device graphics data sections 202 provided in a chip region 201 on a semiconductor substrate 200.

The device graphics data sections 202 composed of three polygonal shapes are formed on the chip region 201, and portions other than the device graphics data sections 202 is a vacant section 201a.

FIG. 15 illustrates the second step "Setting a clearance section and a dummy placement prohibition region". A dummy formation prohibition region 204 is disposed at the top right portion, and a band-shaped clearance section 203 is formed so as to surround each device graphics data section 202.

FIGS. 16A to 16C illustrate the third step "Forming a rectangular dummy pattern (defined by a side of the rectangular dummy pattern and space)".

As shown in FIG. 16A, a plurality of rectangular dummy patterns 207 is formed in the vacant section 201a.

Firstly, as shown in FIG. 16C, the size of a rectangular dummy pattern is defined by specifying the "sides" of the rectangular dummy pattern. The layout on which the rectangular dummy patterns are formed is determined by disposing the rectangular dummy patterns with the determined size in the "spaces" of the vacant section 201a without gaps.

FIG. 16B is an enlarged schematic plan view illustrating a center portion in FIG. 16A, while FIG. 16C is a view providing an explanation for defining a rectangular dummy pattern.

As shown in FIG. 16C, the rectangular dummy pattern 207 is formed in a square form defined with one side of length "L".

A space section 208 whose width is defined as "s" and which surrounds the rectangular dummy pattern 207 is defined.

Next, as shown in FIGS. 16A and 16B, rectangular dummy pattern units 209 defined by the rectangular dummy pattern 207 and the space section 208 are disposed without gap in the vacant section 201a.

However, the size of the rectangular dummy pattern unit is much larger than the remaining portion in the boundary region of the clearance section 203 or the dummy formation prohibition region 204. Therefore, there is a limitation that a larger rectangular dummy pattern unit cannot be disposed. Thus, vacant regions 201b and 201c on which rectangular dummy patterns cannot be formed, are formed between the clearance section 203 and the rectangular dummy pattern unit 209.

The width of the vacant region 201c is larger than that of the vacant region 201b.

FIG. 17 illustrates the fourth step "Removing an unnecessary definition section". In FIG. 17, the clearance section 203 and the dummy formation prohibition region 204 have been removed.

Vacant sections 201f and 201g are formed around the device graphics data sections 202.

The width of the vacant section 201f is specified as the sum of the width of the clearance section 3, width of the vacant section 201b, and width "s" of space section 208 of rectangular dummy pattern unit 209. The width of the vacant section 201g is specified as the sum of the width of the clearance section 3, width of the vacant section 201c, and width "s" of the space section 208 of the rectangular dummy pattern unit 209.

Therefore, the width of the vacant section 201g has made larger than the width of the vacant section 201f.

For this reason, uniform pattern density of the surface of the semiconductor substrate could not be obtained, and as a result, dishing or erosion phenomenon could not be suppressed.

SUMMARY OF THE INVENTION

The invention has an object of offering a method for designing a dummy pattern for forming dummy patterns at an optimum density and an optimum disposition in order to inhibit the dishing and erosion phenomena that occur when a surface of a semiconductor substrate is planarized by the CMP process.

A first aspect of the invention provides the method for designing a dummy pattern that is formed in a vacant section of a chip region before a semiconductor substrate including the chip region that has a device graphics data section in which a circuit element pattern is formed and the vacant section in which the circuit element pattern is not formed is planarized by a chemical mechanical polishing process. The method includes: setting an overall dummy section on the entire chip region; setting a mesh section on the entire overall dummy section; dividing the overall dummy section by the mesh section so that a plurality of rectangular dummy patterns is formed on the entire chip region after the mesh section is set; and removing or transforming a part of the rectangular dummy patterns, thereby uniformizing a density of the dummy pattern in the chip region.

It is preferable that, in the method of the first aspect of the invention, the uniformizing of the density of the dummy pattern include: setting a clearance section surrounding the device graphics data section; setting a dummy formation prohibition region on a part of the vacant section; extracting four rectangular dummy patterns based on a location of the rectangular dummy patterns relative to three regions that are the device graphics data section, the clearance section, and the dummy formation prohibition region, after the dummy formation prohibition region is set; and performing four-step processes in accordance with the four rectangular dummy patterns.

It is preferable that, in the method of the first aspect of the invention, a first step of the four-step processes include: extracting the rectangular dummy pattern that is perfectly overlapped with one or two of the three regions; and removing the rectangular dummy pattern that has been extracted.

It is preferable that, in the method of the first aspect of the invention, a second step of the four-step processes include: extracting the rectangular dummy pattern whose three sides are in contact with the clearance section or the dummy formation prohibition region; removing a portion of the extracted rectangular dummy pattern, that is overlapped with the clearance section or the dummy formation prohibition region; and extending the rectangular dummy patterns that remain after the portion has been removed, to an adjacent rectangular dummy pattern so that these rectangular dummy patterns are synthesized and so that a new dummy pattern is formed.

It is preferable that, in the method of the first aspect of the invention, a third step of the four-step processes include: extracting the rectangular dummy pattern whose four sides are in contact with the clearance section or the dummy formation prohibition region; extending the rectangular dummy patterns that have been extracted to an adjacent rectangular dummy pattern so that these rectangular dummy patterns are synthesized; and removing a portion at which the rectangular dummy patterns that have been synthesized overlap the clearance section or the dummy formation prohibition region so that a new dummy pattern is formed.

It is preferable that, in the method of the first aspect of the invention, a fourth step of the four-step processes include: extracting the rectangular dummy pattern whose two sides are in contact with the clearance section or the dummy formation prohibition region; extending the rectangular dummy patterns that have been extracted to an adjacent rectangular dummy pattern so that these rectangular dummy patterns are synthesized; and removing a portion at which the rectangular dummy patterns that have been synthesized overlap the clearance section or the dummy formation prohibition region so that a new dummy pattern is formed.

A second aspect of the invention provides an exposure mask including a dummy pattern that is disposed by the method for designing the dummy pattern described above.

A third aspect of the invention provides a semiconductor device including a dummy pattern that is disposed by the method for designing the dummy pattern described above.

A fourth aspect of the invention provides a method for manufacturing a semiconductor device, including a forming a dummy pattern that is disposed by the method for designing the dummy pattern described above.

A fifth aspect of the invention provides a storage medium having a dummy pattern design program stored therein for designing a dummy pattern that is formed in a vacant section of a chip region before a semiconductor substrate including the chip region that has a device graphics data section in which a circuit element pattern is formed and the vacant section in which the circuit element pattern is not formed is planarized by a chemical mechanical polishing process, and a computer which executes the dummy pattern design program. The dummy pattern design program includes: extracting the chip region and the device graphics data; setting a region on which the dummy pattern is not formed; forming an overall dummy on the entire chip region; forming a mesh section for forming the overall dummy in a rectangular form; forming the overall dummy in a rectangular form in accordance with the mesh section so that a rectangular dummy pattern is formed; removing an unnecessary rectangular dummy pattern; performing a process for extracting, synthesizing, and removing with regard to rectangular dummy pattern with contact on three sides; performing a process for extracting, synthesizing, and removing with regard to rectangular dummy pattern with contact on four sides; performing a process for extracting, synthesizing, and removing with regard to rectangular dummy pattern with contact on two sides; and removing an unnecessary definition section.

According to the invention, it is possible to provide a method for designing a dummy pattern for forming dummy patterns at an optimum density and an optimum disposition in order to inhibit the dishing and erosion phenomena that occur when a surface of a semiconductor substrate is planarized by the CMP process.

BRIEF DESCRIPTION OF THE DRAWINGS

FIG. 3 is a schematic plan view illustrating an example of the steps for designing the dummy pattern of the embodiment of the invention.

FIG. 4 is a schematic plan view illustrating an example of the steps for designing the dummy pattern of the embodiment of the invention.

FIG. 5 is a schematic plan view illustrating an example of the steps for designing the dummy pattern of the embodiment of the invention.

FIG. 16B is an enlarged schematic plan view illustrating a center portion in FIG. 16A, and FIG. 16C is a view providing an explanation for defining a rectangular dummy pattern.

DETAILED DESCRIPTION OF THE INVENTION

Hereinafter, embodiments of the invention will be described with reference to the drawings.

First Embodiment

Figure 1:
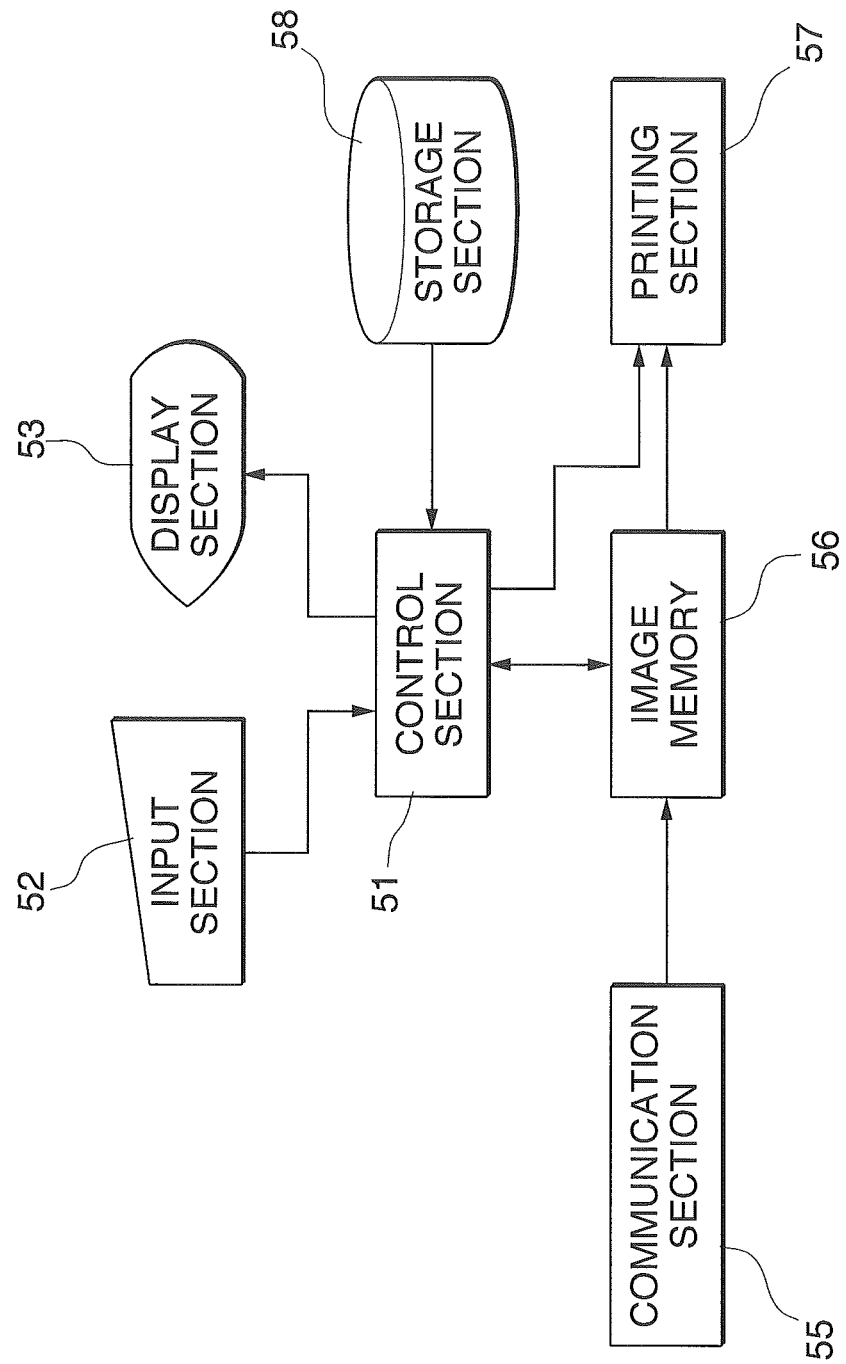
FIG. 1 is a block diagram showing the configuration of computer system that executes a dummy pattern design program of an embodiment of the invention.

FIG. 1 is a block diagram showing the configuration of computer system that executes a dummy pattern design program of an embodiment of the invention. In FIG. 1, reference symbol 51 denotes the control section which executes comprehensive control of the processing operation of a dummy pattern design program of the first embodiment of the invention. Reference symbol 52 is an input section configured from a numeric keypad, function keys, a touchscreen, or the like. Reference symbol 53 is a display section configured from a liquid crystal display or the like. Reference symbol 55 is a communication section which receives the data including dummy pattern data that is used for the processing operation for manufacturing a semiconductor device from a host computer. Reference symbol 56 is memory which stores the data that has been received by the communication section 55. Reference symbol 57 is a printing section which performs printing to a form, based on the data stored in the memory 56. Reference symbol 58 is a message data storage section (storage medium) which stores the dummy pattern design program.

Figure 2:
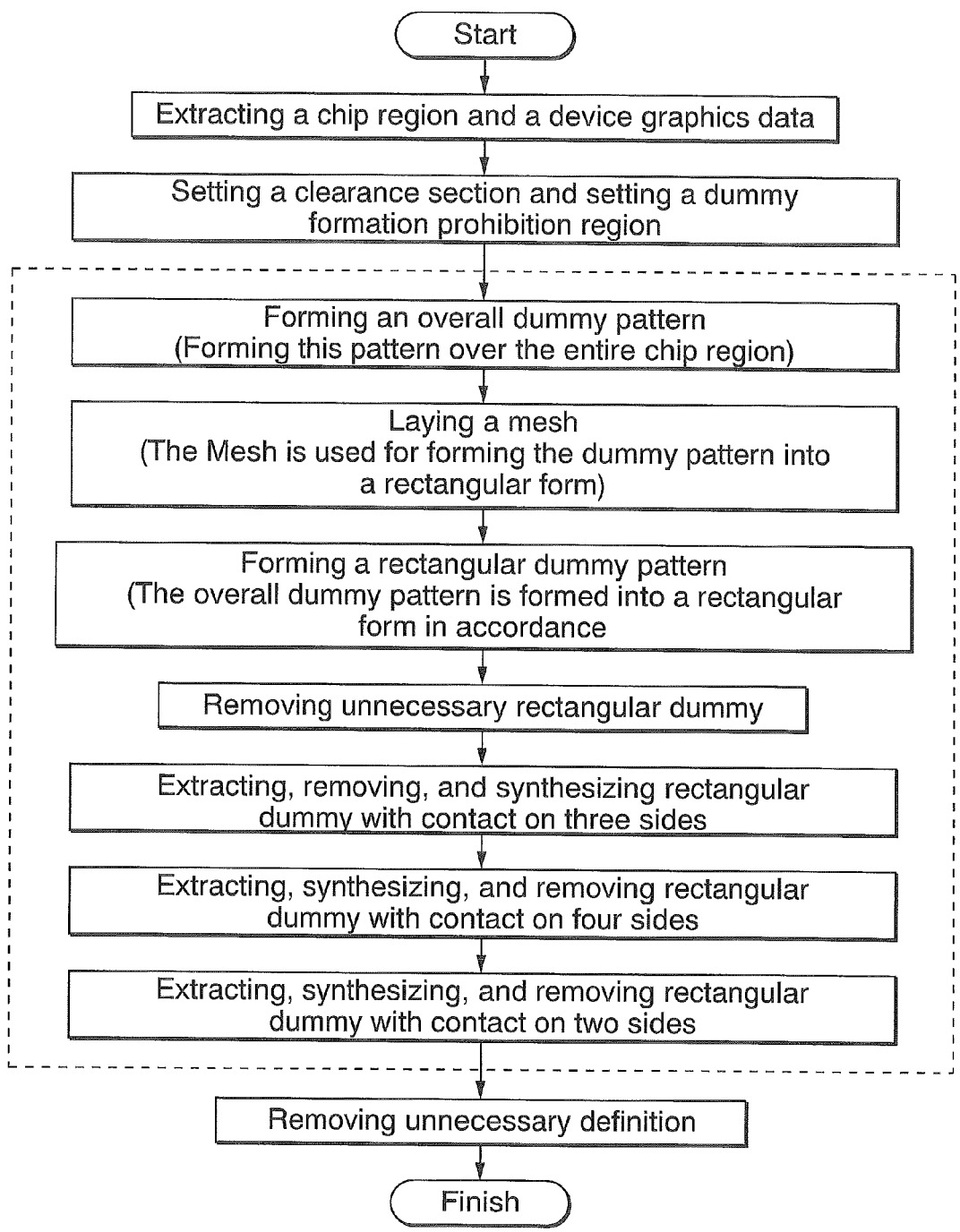
FIG. 2 is a flowchart illustrating an example of the steps for designing the dummy pattern of the embodiment of the invention.

FIG. 2 is a flowchart illustrating an example of a method for designing a dummy pattern of a first embodiment of the invention.

The method for designing a dummy pattern of the first embodiment of the invention includes the ten steps mentioned below.

(1) Extracting chip region and device graphics data
(2) Setting clearance section and setting dummy formation prohibition region
(3) Forming an overall dummy section
(4) Laying a mesh
(5) Forming a rectangular dummy pattern
(6) Removing unnecessary rectangular dummy pattern
(7) Extracting, Removing, and Synthesizing rectangular dummy pattern with contact on three sides
(8) Extracting, Synthesizing, and Removing rectangular dummy pattern with contact on four sides
(9) Extracting, Synthesizing, and Removing rectangular dummy pattern with contact on two sides
(10) Removing unnecessary definition section The steps from (1) to (5) are the steps for forming a rectangular dummy pattern in which rectangular dummy patterns are formed on the entire surface of the semiconductor substrate. The Steps (6) to (10) are the steps for uniformizing dummy pattern in which the pattern density of the surface of the semiconductor substrate is uniformized by performing one or all of removing the rectangular dummy pattern, partially removing the rectangular dummy pattern, and extending the rectangular dummy pattern, or by performing synthesizing adjacent rectangular dummy patterns.

Each step is explained in detail hereafter.

The steps for forming a rectangular dummy pattern from steps (1) to (5) includes the steps of forming an overall dummy section covering the entire surface of the semiconductor substrate thereon, setting a mesh section covering the entire surface of the overall dummy section, and then dividing the overall dummy section by the mesh section.

(1) Extracting Chip Region and Device Graphics Data

Firstly, as shown in FIG. 3, the logical variable that defines a size, a shape, and a layout of a chip region 1 in a semiconductor substrate 100 is taken as definition A.

The logical variable that defines a size, a shape, and a layout of a device graphics data section 2 is taken as definition B.

Here, three device graphics data sections 2 are defined in the chip region 1.

The region in which no device graphics data 2 is formed in the chip region 1 is taken as vacant section 1a.

(2) Setting Clearance Section and Setting Dummy Formation Prohibition Region

Next, as shown in FIG. 4, a clearance section 3 is formed to surround the device graphics data section 2 on all the sides.

Definition C is a variable that defines the size, the shape, and the layout of this clearance section 3.

The clearance section 3 is a band-shaped region with a predetermined width.

It is well known that when a dummy pattern is formed substantially close to a device graphics data section 2, the dummy pattern affects the electrical characteristics of the device graphics data section 2. However, when the clearance section 3 is provided and the dummy pattern is separated from the device graphics data section 2, electrical effects of the dummy pattern can be reduced.

A dummy formation prohibition region 4 is defined for a region in which graphics data of dummy patterns and the like cannot be disposed because of circuit restrictions. A fuse region and the like, is an example of such a region.

(3) Forming an Overall Dummy Section

Next, as shown in FIG. 5, an overall dummy section 5 is formed over the entire surface of the chip region 1 of the semiconductor substrate 100.

The variable that defines the size, the shape, and the layout of this overall dummy section 5 is definition E.

(4) Laying a Mesh

Figure 6A:
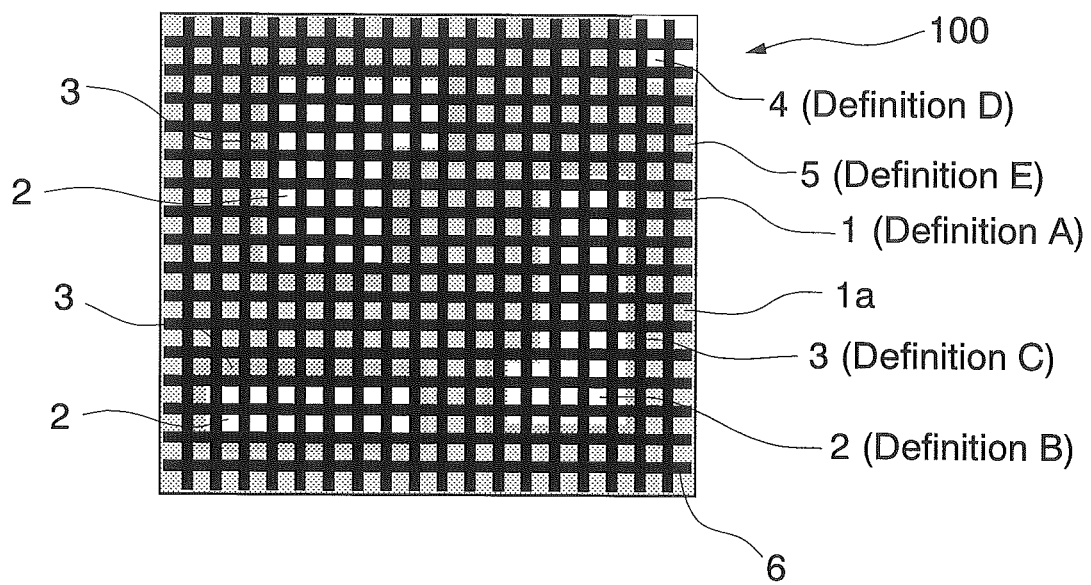
FIG. 6A is schematic plan view illustrating an example of the steps for designing the dummy pattern of the embodiment of the invention.
Figure 6B:
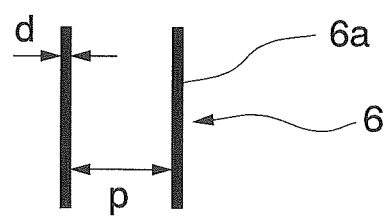
FIG. 6B is an enlarged view of FIG. 6A.

Next, as shown in FIGS. 6A and 6B, a mesh section 6 is formed by mesh lines 6a in grid-shape in the X-axis and Y-axis directions of the semiconductor substrate 100.

Definition F is a variable that defines the size, the shape and the layout of the mesh section 6.

As shown in FIG. 6B, the mesh section 6 may be formed by mesh lines 6a, which may be optionally set to a thickness "d" and a pitch "p".

For example, the thickness "d" of the mesh line 6a may be taken as 0.5 µm, and the pitch "p" of the mesh line 6a may be taken as 1 µm.

The thickness "d" of a mesh line 6a becomes the distance between rectangular dummy patterns, while the pitch "p" of the mesh line 6a becomes the length of one side of a rectangular dummy pattern.

(5) Forming a Rectangular Dummy Pattern

Figure 7:
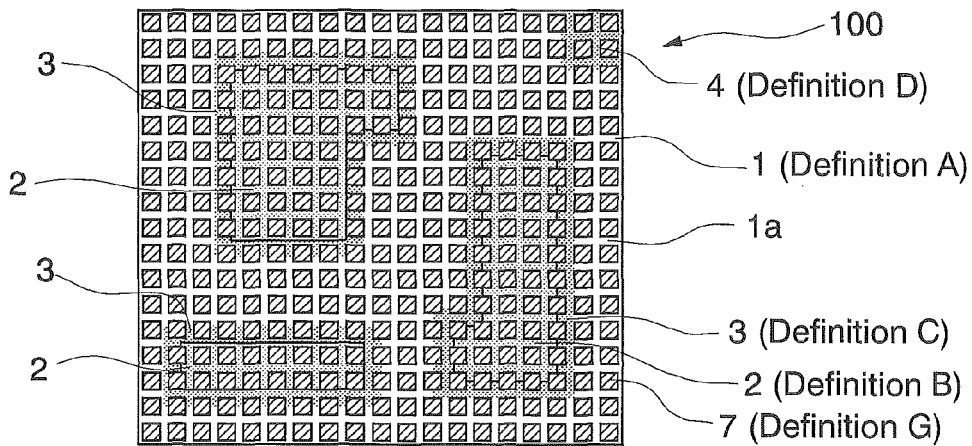
FIG. 7 is a schematic plan view illustrating an example of the steps for designing the dummy pattern of the embodiment of the invention.

Next, as shown in FIG. 7, a rectangular dummy pattern 7 is defined based on the size, the shape, and the layout indicated by a definition G, defined by the logical expression (1-1) given below, using the definition E and the definition E (Expression 1)

$$G = E \text{ and (not } F\text{)} \tag{1-1}$$

A plurality of rectangular dummy patterns 7 are formed over the entire surface of the chip region 1 of the semiconductor substrate 100.

The device graphics data section 2, the clearance section 3, and the dummy formation prohibition region 4 are visible from between the formed rectangular dummy patterns 7.

The steps described above constitute the steps for forming a rectangular dummy pattern.

Next, the dummy pattern uniformization process is described below.

The process including steps (6) to (10) is the steps for uniformizing dummy pattern. In this process, the clearance section 3 surrounding the device graphics data section 2 is set, the dummy formation prohibition region 4 is set in a part of the vacant section 1*a*, and four rectangular dummy patterns are extracted by disposing the rectangular dummy patterns 7 corresponding to the three regions, namely, the dummy formation prohibition region 4, the clearance section 3, and the device graphics data section 2, and the pattern density of the chip region 1 of the semiconductor substrate 100 is uniformized by four-step processing in accordance with the four rectangular dummy patterns.

(6) Removing Unnecessary Rectangular Dummy Pattern

The first step of the processing steps is a step for removing unnecessary rectangular dummy patterns, in which the rectangular dummy patterns whose all four sides are included in one or two of the three regions are extracted, thereafter, the extracted rectangular dummy patterns 7 are removed.

Figure 8A:
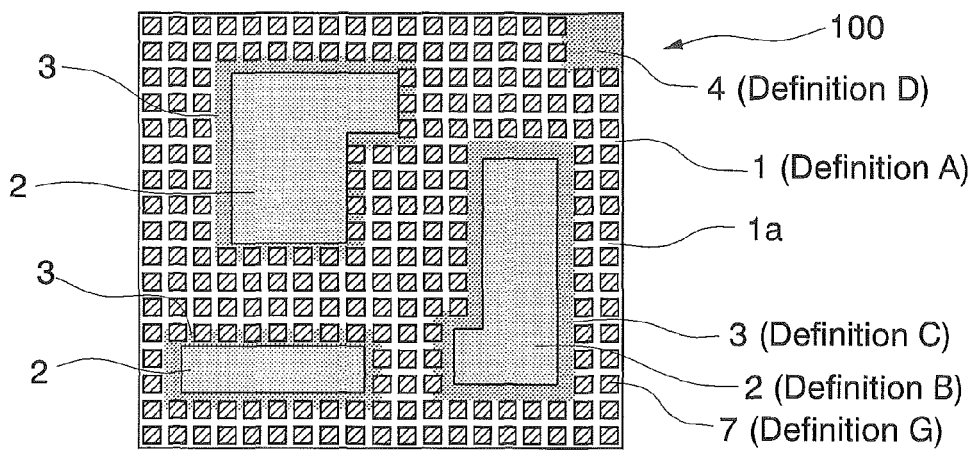
FIG. 8A is a schematic plan view illustrating an example of the steps for designing the dummy pattern of the embodiment of the invention.
Figure 8B:
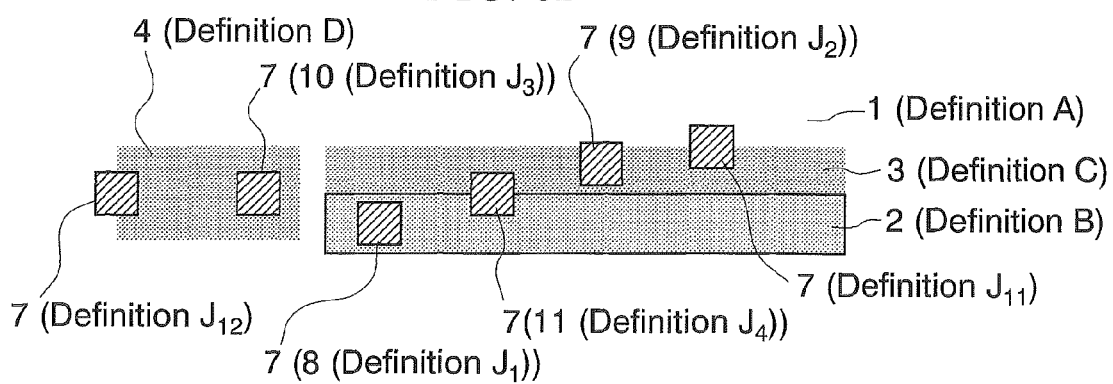
FIG. 8B is a view illustrating examples of definitions defined by logical expressions.

As shown in FIGS. 8A and 8B, the unnecessary rectangular dummy patterns 8, 9, 10, and 11 are defined based on the size, the shape, and the layout indicated by definition $J_1$, $J_2$, $J_3$, and $J_4$ defined by the logical expressions (1-2) to (1-5) given below.
Thereafter, these unnecessary rectangular dummy patterns, 8, 9, 10 and 11 are removed.

(Expression 2)

$$J_1 = G \text{ and } B \quad (1\text{-}2)$$

(Expression 3)

$$J_2 = G \text{ and } C \quad (1\text{-}3)$$

(Expression 4)

$$J_3 = G \text{ and } D \quad (1\text{-}4)$$

(Expression 5)

$$J_4 = G \text{ and } (B \text{ and } C) \quad (1\text{-}5)$$

FIG. 8B shows examples of the definitions $J_1$, $J_2$, $J_3$, and $J_4$ defined by the logical expressions (1-2) to (1-5).

In this way, the definition $J_1$ defined by the logical expression (1-2) signifies that the rectangular dummy pattern 7 is included in the device graphics data section 2 defined by definition B.

Moreover, the definition $J_2$ defined by the logical expression (1-3) signifies that the rectangular dummy pattern 7 is included in the clearance section 3 defined by the definition C.

Furthermore, the definition $J_3$ defined by the logical expression (1-4) signifies that the rectangular dummy pattern 7 is included in the dummy formation prohibition region 4 defined by the definition D.

Also, the definition $J_4$ defined by the logical expression (1-5) signifies that the rectangular dummy pattern 7 partially overlaps both regions namely, the device graphics data section 2 defined by the definition B and the clearance section 3 defined by the definition D.

A definition $J_{11}$ showing an example of the rectangular dummy pattern 7 partially overlapping the clearance section 3 defined by the definition C, and a definition $J_{12}$ showing an example of the rectangular dummy pattern 7 partially overlapping the dummy formation prohibition region 4 defined by the definition D, are each shown as examples of non-removal.

(7) Extracting, Removing, and Synthesizing Rectangular Dummy Pattern with Contact on Three Sides The second step of the processing steps is a step for forming a new dummy pattern 30. In this step, a rectangular dummy pattern 7 whose three sides are in contact with the clearance section 3 or the dummy formation prohibition region 4 is extracted. Thereafter, the portion of the extracted rectangular dummy pattern, that overlaps the clearance section 3 or the dummy formation prohibition region 4, is removed, and the rectangular dummy pattern remaining after removal is extended up to the adjacent rectangular dummy pattern 7 and synthesized so as to form a new dummy pattern.

Figure 9A:
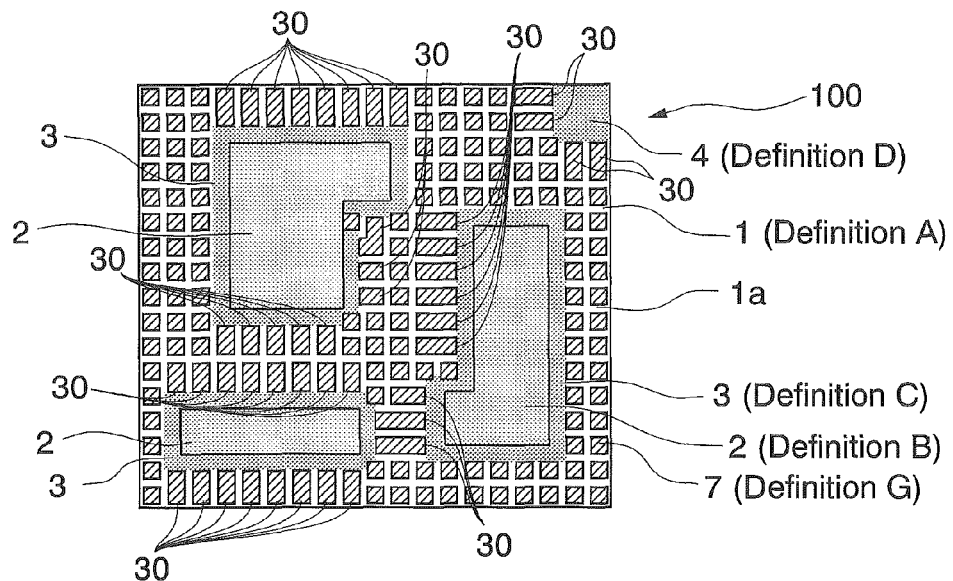
FIG. 9A is a schematic plan view illustrating an example of the steps for designing the dummy pattern of the embodiment of the invention.

FIG. 9A is a schematic plan view illustrating an example of the dummy patterns 30 formed in the second step of the processing steps.

The dummy patterns 30 whose number is greater than or equal to forty-five are formed around the clearance sections 3 and the dummy formation prohibition region 4.

Figure 9B:
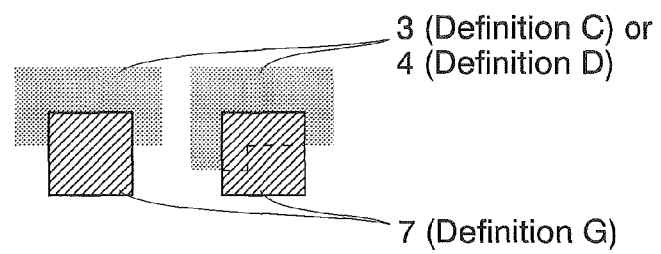
FIG. 9B is an enlarged view illustrating two examples of definitions with regard to rectangular dummy patterns whose three sides are in contact with a clearance section or a dummy formation prohibition region.

FIG. 9B shows two examples of definitions of a rectangular dummy pattern with contact on three sides.

The first example is the case when the clearance section 3 (definition C) or the dummy formation prohibition region 4 (definition D) is formed in a rectangular region, while the other example is the case when the clearance section 3 (definition C) or the dummy formation prohibition region 4 (definition D) is formed in a polygon-shaped region.

In either case, the rectangular dummy pattern 7 (definition G) partially overlaps the clearance section 3 (definition C) or the dummy formation prohibition region 4 (definition D), with one side fully included and two sides partially included in the region.

Figure 9C:
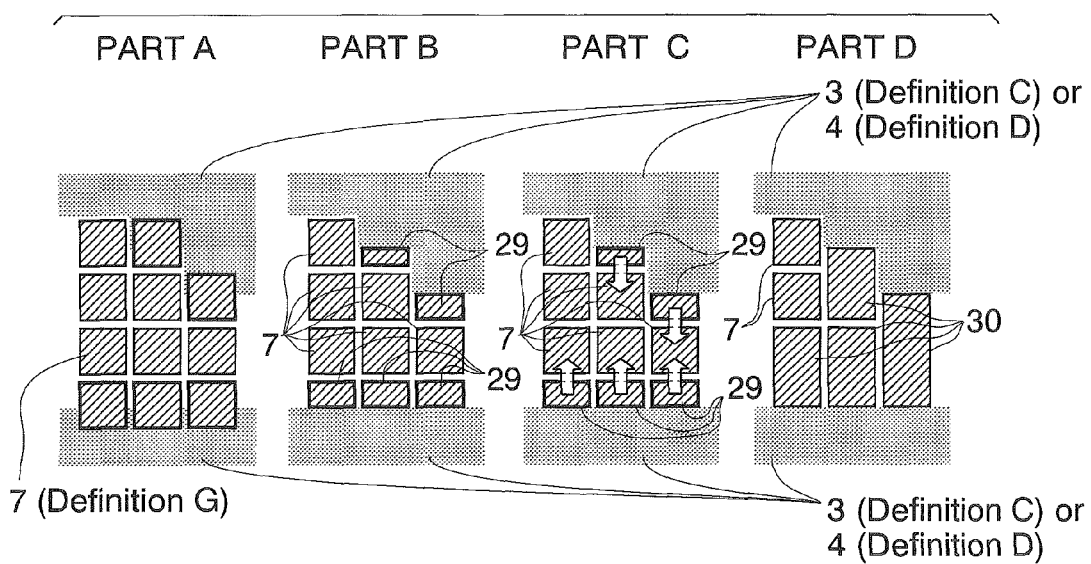
FIG. 9C is an enlarged view illustrating extracting, removing, and synthesizing the rectangular dummy pattern with contact on three sides.

FIG. 9C is an enlarged view illustrating the second step of the processing steps and showing a part of the semiconductor substrate 100. This step includes three steps, namely extracting, removing, and synthesizing.

During the extracting step, a rectangular dummy pattern 7 whose three sides are in contact with the clearance section 3 or the dummy formation prohibition region 4 and which corresponds to a rectangular dummy pattern with contact on three sides, based on the definition of rectangular dummy pattern with contact on three sides, is extracted.

Next, during the removing step, portions of the rectangular dummy pattern with contact on three sides, that is overlapped the clearance section or the dummy formation prohibition region, is removed.

Finally, the synthesizing step is performed for the rectangular dummy pattern 7 that has been removed.

The synthesizing step includes extending the region opposite to the side from which the rectangular dummy pattern 7 was removed in the direction of the side opposite to the etched out side, and synthesizing it into the adjacent rectangular dummy pattern.

The extension amount in the synthesizing step is preferably taken as mesh size "d" of the definition F.

When the extension amount is taken as the mesh size "d", the rectangular dummy pattern removed up to the adjacent rectangular dummy pattern can be extended, and the synthesizing of the patterns can be performed easily.

(8) Extracting, Synthesizing, and Removing Rectangular Dummy Pattern with Contact on Four Sides The third step of the processing steps is a step for forming a new dummy pattern 40. In this step, a rectangular dummy pattern 7 whose four sides are in contact with the clearance section 3 or with the dummy formation prohibition region 4 is extracted. Thereafter, the extracted rectangular dummy pattern is extended up to the adjacent rectangular dummy pattern 7 and synthesized thereinto. Then, the portion of the synthesized rectangular dummy pattern, that overlaps the clearance section 3 or the dummy formation prohibition region 4 is removed, and a new dummy pattern is formed.

Figure 10A:
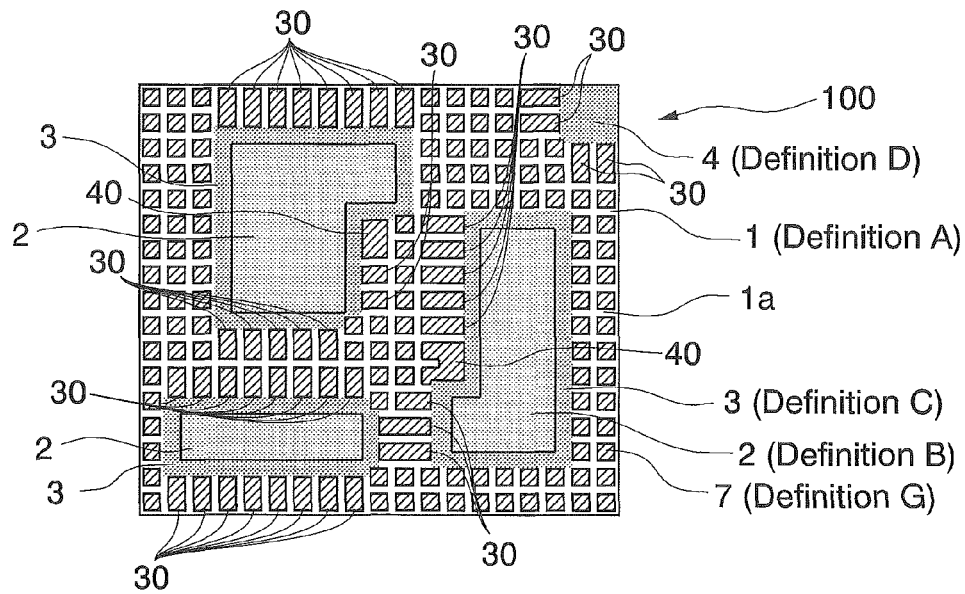
FIG. 10A is a schematic plan view illustrating an example of the steps for designing the dummy pattern of the embodiment of the invention.

FIG. 10A is a schematic plan view illustrating an example of the rectangular dummy pattern 40 formed in the third step of the processing steps.

Two rectangular dummy patterns 40 are formed around the clearance section 3 and the dummy formation prohibition region 4.

Figure 10B:
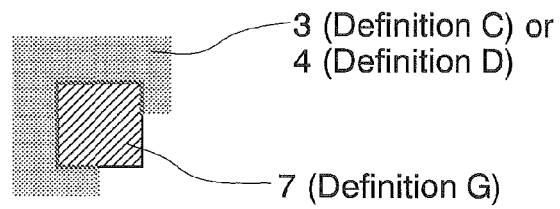
FIG. 10B is an enlarged view illustrating an example of definitions with regard to rectangular dummy patterns whose four sides are in contact with a clearance section or a dummy formation prohibition region.

FIG. 10B illustrates a definition of a rectangular dummy pattern with contact on four sides.

The rectangular dummy pattern 7 (definition G) is partially overlapped on the clearance section 3 (definition C) that is formed in a reversed L-shape, or the dummy formation prohibition region 4 (definition D). Two sides are fully included in the region, while the remaining two sides are partially included in the region.

Figure 10C:
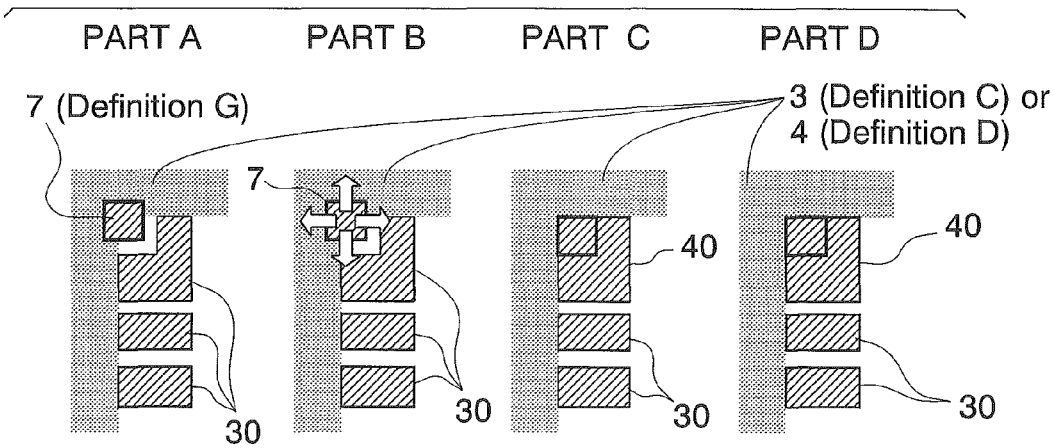
FIG. 10C is an enlarged view illustrating extracting, synthesizing, and removing the rectangular dummy pattern with contact on four sides.

FIG. 10C is an enlarged view illustrating the third step of the processing steps and showing a part of the semiconductor substrate 100. This step includes three steps, namely extracting, synthesizing, and removing.

During the extracting step, a rectangular dummy pattern 7 whose four sides are in contact with the clearance section 3 or the dummy formation prohibition region 4 and which corresponds to a rectangular dummy pattern with contact on four sides, based on the definition of rectangular dummy pattern with contact on four sides, is extracted.

Next, the rectangular dummy patterns 7, which are rectangular dummy patterns with four sides in contact, are synthesized.

The synthesizing step includes over-sizing the rectangular dummy pattern 7 by extending it in all directions and synthesizing it into the adjacent rectangular dummy pattern.

The extension amount is preferably taken as the mesh size "d" of the definition F.

Finally, during the removing step, portions of the rectangular dummy pattern with contact on four sides, that is overlapped the clearance section or the dummy formation prohibition region, is removed. The rectangular dummy pattern 40 is thereby formed.

(9) Extracting, Synthesizing, and Removing Rectangular Dummy Pattern with Contact on Two Sides The fourth step of the processing steps is a step for forming a new dummy pattern 20. In this step, a rectangular dummy pattern 7 whose two sides are in contact with the clearance section 3 or with the dummy formation prohibition region 4 is extracted. Thereafter, the extracted rectangular dummy pattern is extended up to the adjacent rectangular dummy pattern 7 and synthesized thereinto. Then, the portion of the synthesized rectangular dummy pattern, that overlaps the clearance section 3 or the dummy formation prohibition region 4 is removed, and a new dummy pattern is formed.

Figure 11A:
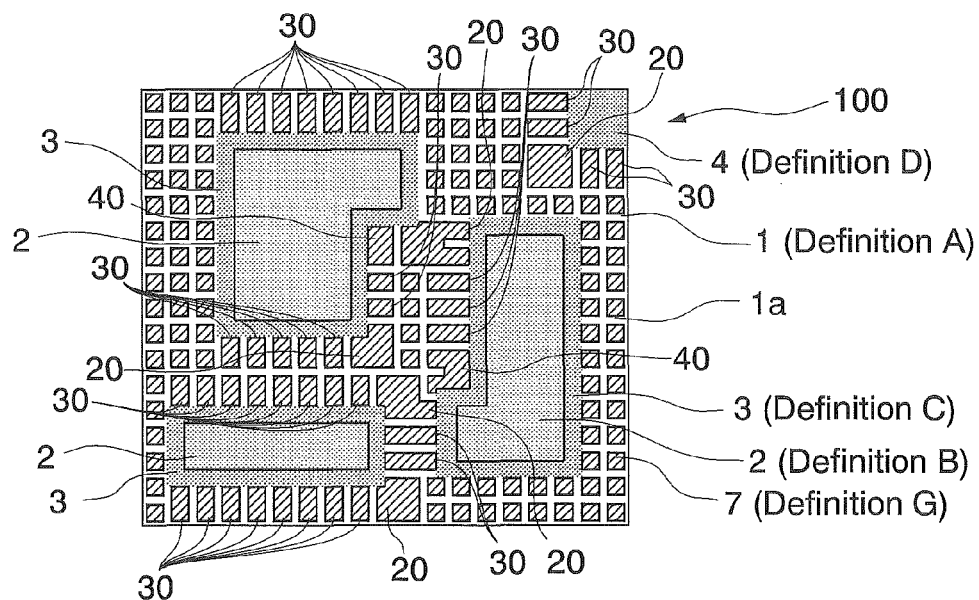
FIG. 11A is a schematic plan view illustrating an example of the steps for designing the dummy pattern of the embodiment of the invention.

FIG. 11A is a schematic plan view illustrating an example of a rectangular dummy pattern 20 formed by the fourth step of the processing steps.

Five rectangular dummy patterns 20 are formed around the clearance section 3 and the dummy formation prohibition region 4.

Figure 11B:
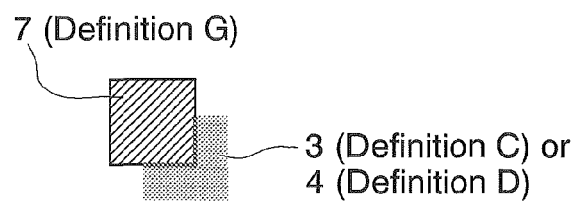
FIG. 11B is an enlarged view illustrating an example of definitions with regard to rectangular dummy patterns whose two sides are in contact with a clearance section or a dummy formation prohibition region.

FIG. 11B illustrates a definition of a rectangular dummy pattern with contact on two sides.

A rectangular dummy pattern 7 (definition G) is partially overlapped on the rectangular clearance section 3 (definition C) or on the dummy formation prohibition region 4 (definition D), and two sides are partially included in the region.

Figure 11C:
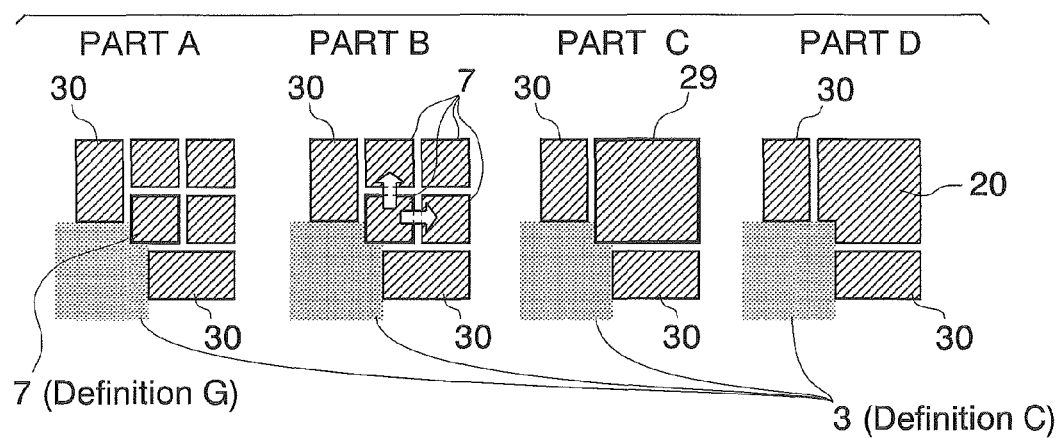
FIG. 11C is an enlarged view illustrating extracting, synthesizing, and removing the rectangular dummy pattern with contact on two sides.

FIG. 11C is an enlarged view illustrating the fourth step of the processing steps including the three steps of extraction, synthesizing, and removing, and showing a part of the semiconductor substrate 100.

During the extracting step, a rectangular dummy pattern 7 whose two sides are in contact with the clearance section 3 or the dummy formation prohibition region 4 and which corresponds to rectangular dummy pattern with contact on two sides based on the definition of a rectangular dummy pattern with contact on two sides, is extracted.

Next, the rectangular dummy patterns 7, which are rectangular dummy patterns with two sides in contact, are synthesized.

The synthesizing is a step in which the two sides of the rectangular dummy patterns 7 that are not in contact with a dummy pattern with two sides in contact are each extended in the direction of an adjacent rectangular dummy pattern, and synthesized with the adjacent rectangular dummy pattern.

The extension amount is preferably taken as the length "l" defined by the mesh size "d" and the mesh pitch "p" of the definition F, according to the expression (2-1) below.

Four rectangular dummy patterns 7 are synthesized by extending the length "l" in two directions to form one large rectangular dummy pattern 29.

(Expression 6)

$$l=d+p \tag{2-1}$$

Finally, the portion of the synthesized rectangular dummy pattern 29, that overlaps the clearance section 3 or the dummy formation prohibition region 4, is removed, and a rectangular dummy pattern 20 is formed.

(10) Removing Unnecessary Definition Section

Figure 12:
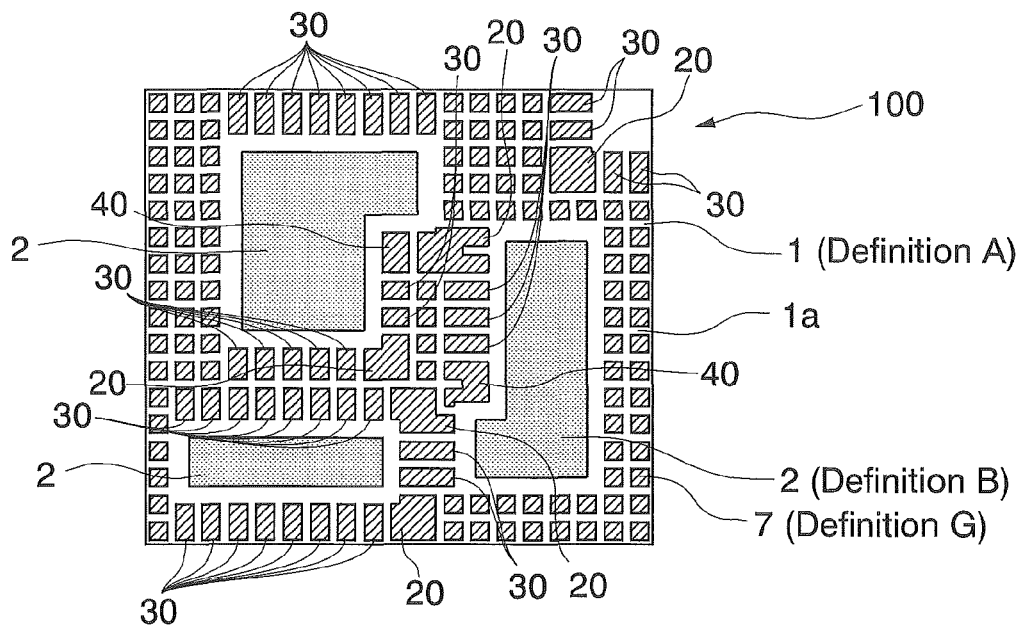
FIG. 12 is a schematic plan view illustrating an example of the steps for designing the dummy pattern of the embodiment of the invention.
Figure 13:
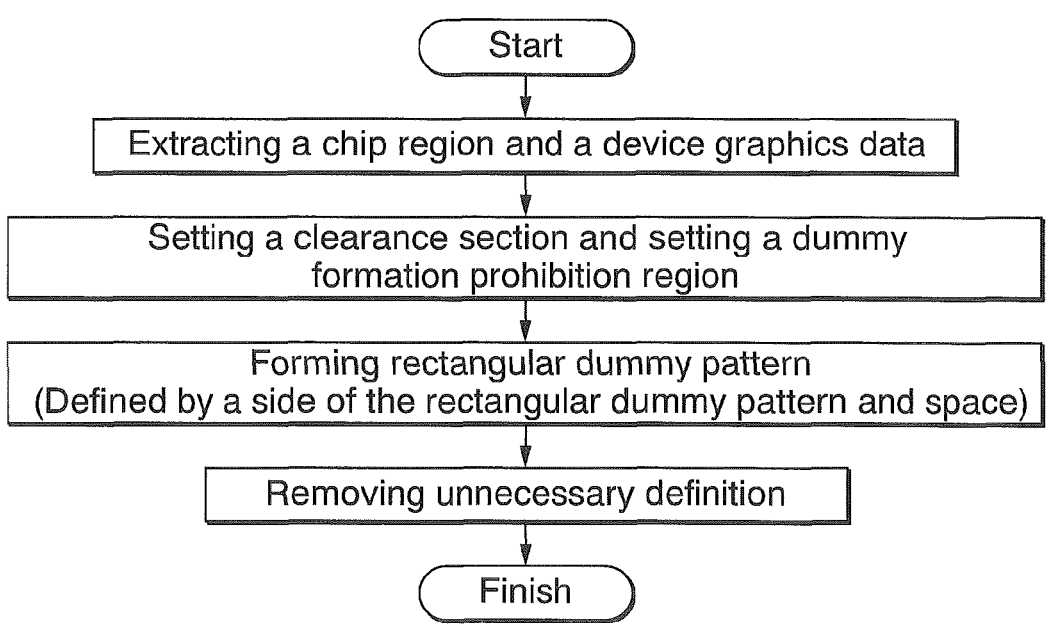
FIG. 13 is a flowchart illustrating an example of conventional steps for designing the dummy pattern.
Figure 14:
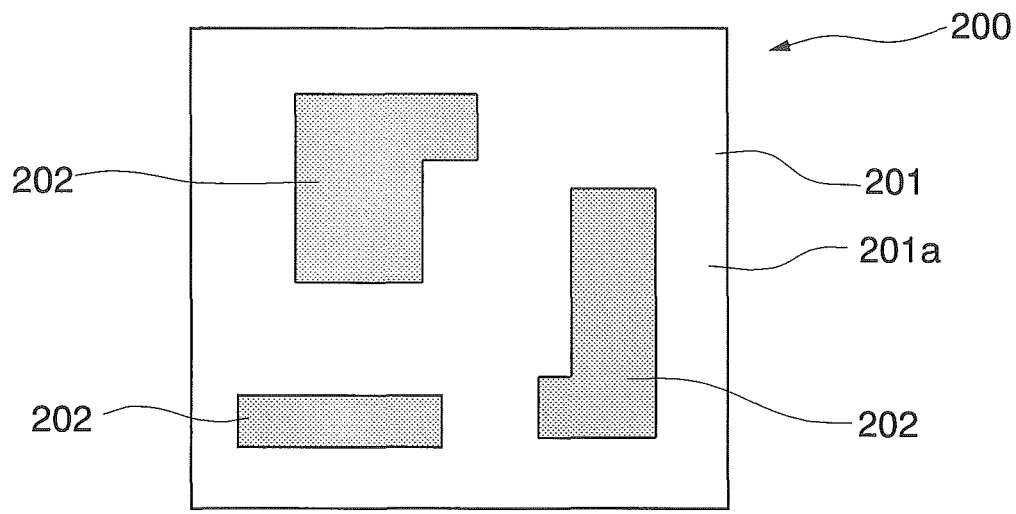
FIG. 14 is a schematic plan view illustrating an example of conventional steps for designing the dummy pattern.
Figure 15:
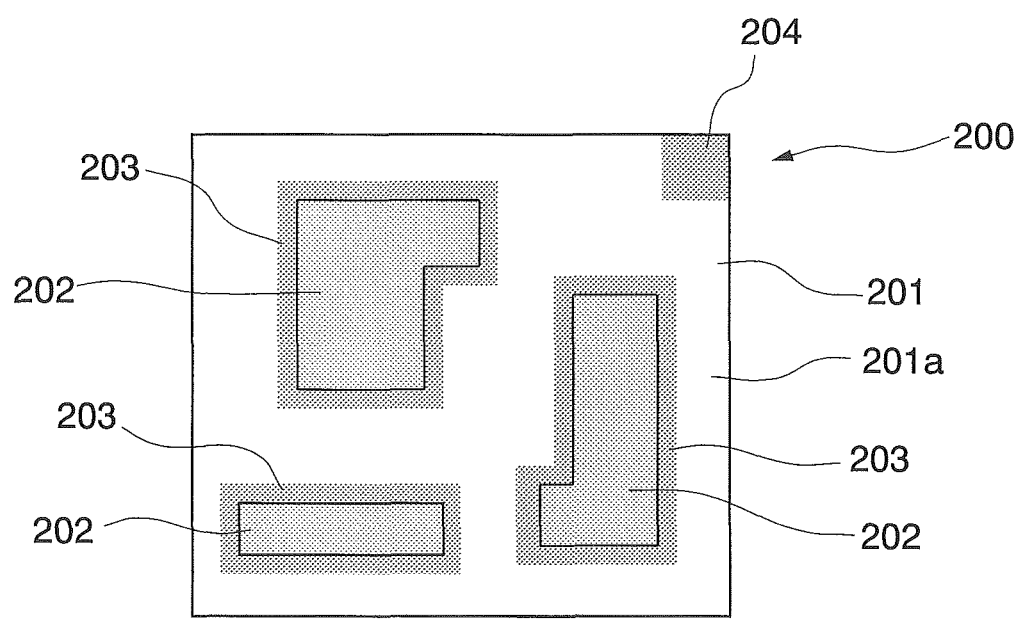
FIG. 15 is a schematic plan view illustrating an example of conventional steps for designing the dummy pattern.
Figure 16A:
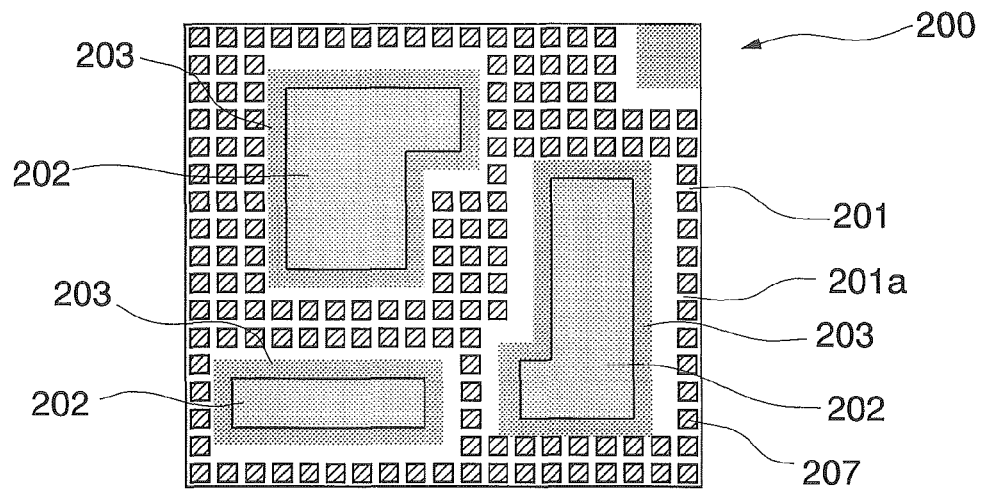
FIG. 16A to 16C is a plan view illustrating examples of conventional steps for designing the dummy pattern.
Figure 16B:
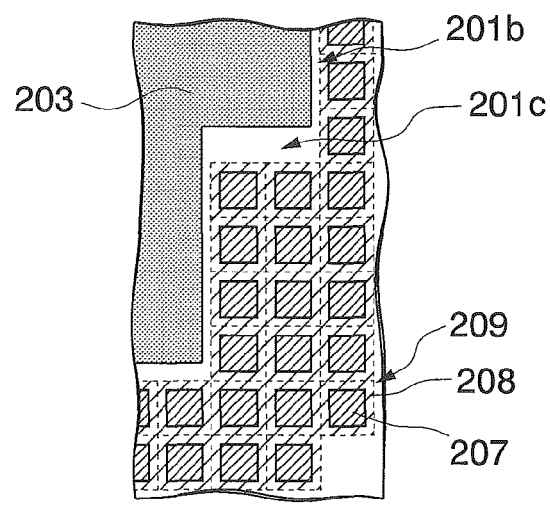
Figure 16C:
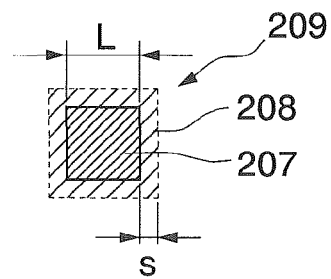
Figure 17:
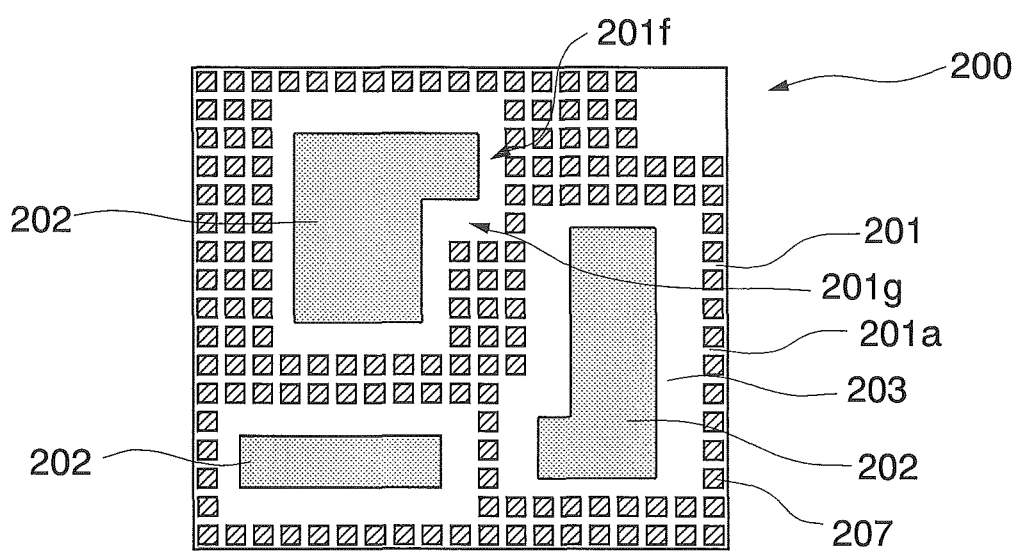
FIG. 17 is a schematic plan view illustrating an example of conventional steps for designing the dummy pattern.

Finally, as shown in FIG. 12, the clearance section 3 defined by definition C and the dummy formation prohibition region 4 defined by definition D are removed, and the designing of the dummy pattern is completed.

Since the optimum width defined by clearance section 3 is defined between the device graphics data section 2 and the rectangular dummy pattern 7, the device graphics data section 2 does not receive electrical effects due to the rectangular dummy pattern 7.

Moreover, a rectangular dummy pattern 7 with optimum density and optimum disposition is formed in the vacant section 1a.

Second Embodiment

Figure 18A:
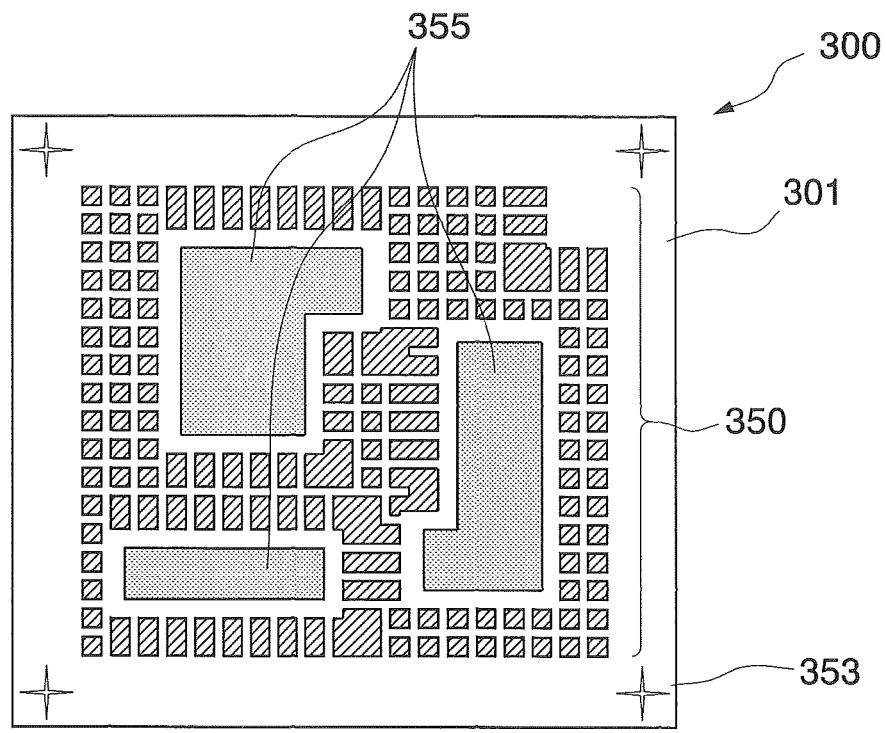
FIGS. 18A and 18B are schematic plan views illustrating an example of an exposure mask of an embodiment of the invention.
Figure 18B:
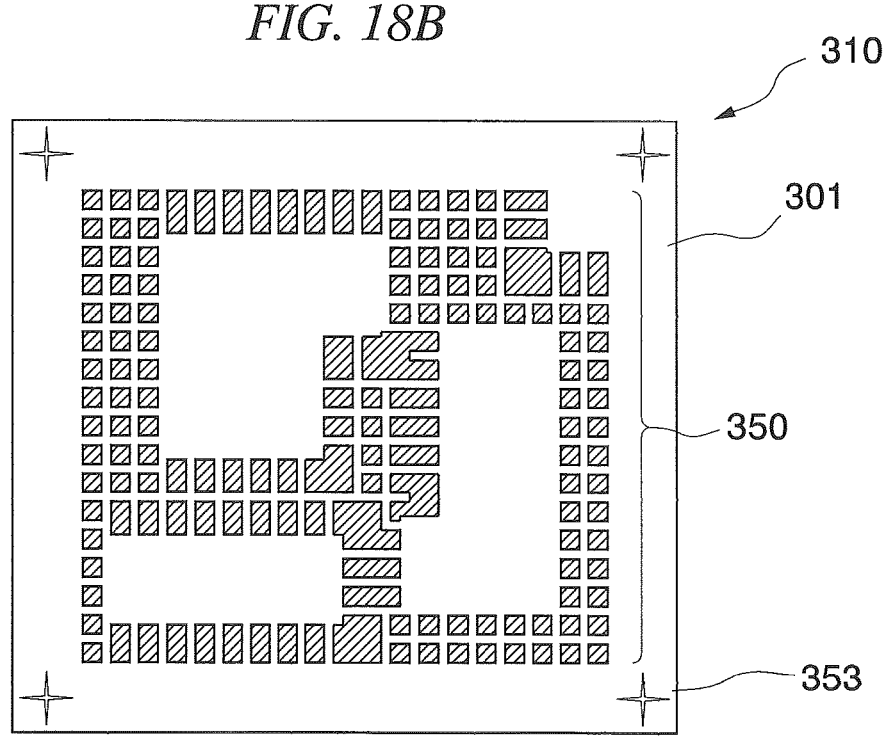

FIGS. 18A and 18B show schematic plan view illustrating an example of an exposure mask of an embodiment of the invention. FIG. 18A shows an exposure mask for forming a device graphics data section and a dummy pattern; while FIG. 18B shows an exposure mask for forming a dummy pattern.

An exposure mask 300 shown in FIG. 18A is provided with an opening 350 composed of dummy patterns designed by the method for designing a dummy pattern on a metal substrate 301, mask alignment sections 353 formed at four corners, and device graphics data sections 355.

By using the exposure mask 300, a circuit element and a rectangular dummy pattern can be formed on the chip region of a semiconductor device in the first exposure process.

An exposure mask 310 for forming dummy patterns shown in FIG. 18B is provided with the opening 350 composed of dummy patterns designed by the method for designing a dummy pattern on the metal substrate 301, and the mask alignment sections 353 formed at the four corners.

By using this exposure mask 310, firstly, rectangular dummy patterns can be formed on the chip region of a semiconductor device in a first exposure process. Thereafter, when a second exposure process is performed by using an exposure mask composed of only device graphics data sections, a circuit element can be formed. Any of the patterns can be formed first.

Third Embodiment

Figure 19:
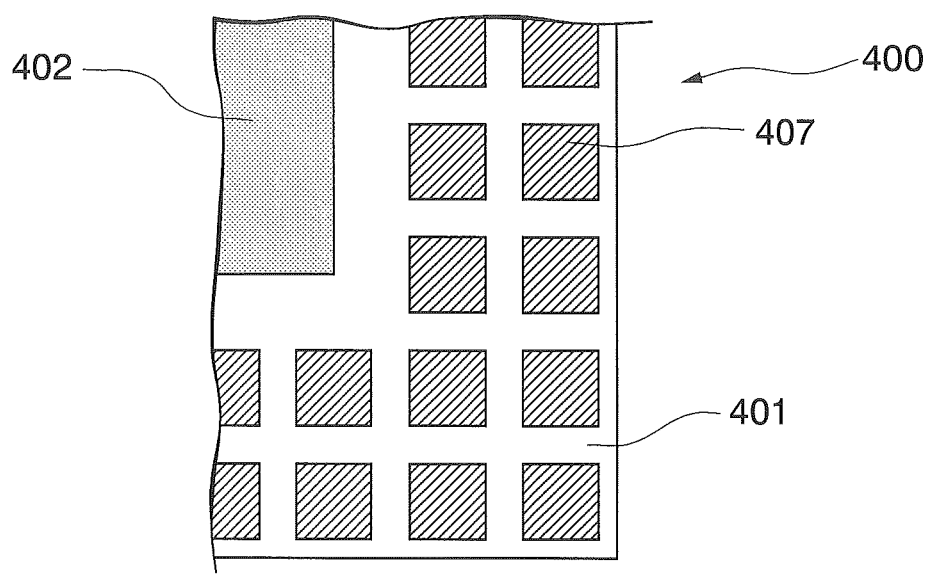
FIG. 19 is an enlarged plan view illustrating an example of a semiconductor device with dummy patterns formed therein of an embodiment of the invention.

FIG. 19 is an enlarged plan view illustrating an example of a semiconductor device with dummy patterns formed therein of an embodiment of the invention.

A circuit element 402 and rectangular dummy patterns 407 are provided in the chip region of a semiconductor device 400.

The rectangular dummy pattern 407 is formed at an optimum disposition and an optimum density. When polishing the chip region 401 by the CMP method, the substrate surface is planarized without the occurrence of problems such as shaving off material to a large depth locally due to a phenomenon such as dishing or erosion.

Fourth Embodiment

The method for manufacturing a semiconductor device of an embodiment of the invention is performed through a dummy pattern design step, an exposure mask manufacturing step, a dummy pattern forming step and a CMP processing step, when planarization is necessary in the manufacturing the semiconductor device.

Firstly, a dummy pattern is designed based on shape, size, and so on, of the device in the chip region of the semiconductor substrate.

Next, an exposure mask is manufactured based on a designed dummy pattern.

Moreover, using the exposure mask in a predetermined processing step, a dummy pattern is formed on the surface of the semiconductor device.

Thereafter, planarization is implemented by the CMP process.

The substrate surface is planarized without the occurrence of problems such as shaving off material to a large depth locally due to a phenomenon such as dishing or erosion. Effects are described hereafter.

The method for designing a dummy pattern of the invention includes dummy pattern classification step that includes a first classification step to a fourth classification step, and a dummy pattern processing step that includes a first processing step to a fourth step processing step. Therefore, dummy patterns can be optimally disposed, the dummy patterns can be formed at optimum density, and empty regions that could not be resolved by conventional method for designing a dummy patterns, can be fully resolved by the method of the invention.

In the method for designing a dummy pattern of the invention, the overall dummy section that covers the entire surface of the semiconductor substrate and the mesh section that covers the entire overall dummy section are set. Thereafter, the overall dummy section is divided by the mesh section so that the rectangular dummy patterns are formed. Therefore, the rectangular dummy patterns can be efficiently and uniformly formed over the entire surface of the semiconductor substrate.

In the method for designing a dummy pattern of the invention, small rectangular dummy patterns formed on the entire chip region by dividing the overall dummy section. Thereafter, the rectangular dummy patterns are removed, and uniformizing step including removing and transforming is performed. Therefore, the rectangular dummy patterns are efficiently formed in the vacant section at the optimum density and the optimum disposition.

The method for designing a dummy pattern of the invention includes processing steps for sequentially implementing removal and synthesizing steps, or includes processing steps for sequentially implementing synthesizing and removal steps so that dummy patterns can be transformed to obtain optimum density and optimum disposition in the vacant section.

The exposure mask of the invention is provided with dummy patterns in a layout disposed by the method for designing a dummy pattern as mentioned above so that dummy patterns can be formed at optimum density and optimum disposition in a vacant section in the chip region of a semiconductor substrate.

The semiconductor device of the invention includes dummy patterns formed using the exposure mask mentioned above, on a surface of a semiconductor substrate so that a semiconductor device can be obtained with dummy patterns formed at optimum density and optimum disposition in a vacant section of the chip region of a semiconductor substrate.

The method for manufacturing a semiconductor device of the invention includes a process to provide steps for forming dummy patterns on a surface of a semiconductor substrate using the exposure mask mentioned above so that dummy patterns can be formed at optimum density and optimum disposition in a vacant section of the chip region of a semiconductor substrate. In the CMP process, the surface of the semiconductor substrate can be planarized without the occurrence of problems such as shaving off material to a large depth locally due to a phenomenon such as dishing or erosion.

As a result, difference between high density and low density in a pattern density distribution of the entire surface of the chip region can be resolved, and the depth of focus in lithography can be enhanced. By ensuring process margin, the quality and productivity of a semiconductor device can also be enhanced.

In the storage medium having a dummy pattern design program of the invention, the dummy pattern design program includes the "Extracting chip region and device graphics data" step for extracting the chip region and the device graphics data, the "Setting clearance section and setting dummy formation prohibition region" for performing settings of a region in which no dummy pattern is formed, the "Forming an overall dummy section" step for forming an overall dummy section on the entire surface of the chip region, the "Laying a mesh" step for laying a mesh for making an overall dummy section rectangular, the "Forming a rectangular dummy pattern" step for making a rectangular overall dummy section according to the mesh, the "Removing unnecessary rectangular dummy pattern" step for removing unnecessary rectangular dummy pattern, the "Extracting, Synthesizing, and Removing rectangular dummy pattern with contact on three sides" step for extracting, synthesizing and removing a rectangular dummy pattern with contact on three sides, an "Extracting, Synthesizing, and Removing rectangular dummy pattern with contact on four sides" step for extracting, synthesizing and removing a rectangular dummy pattern with contact on four sides, an "Extracting, Synthesizing, and Removing rectangular dummy pattern with contact on two sides" step for extracting, synthesizing and removing a rectangular dummy pattern with contact on two sides, and a "Removing unnecessary definition section" step for removing a definitions that is not necessary, so that dummy patterns can be formed at the optimum density and the optimum disposition in a vacant section of the chip region of a semiconductor substrate.

As mentioned above, the invention can be used in the semiconductor industry.

Particularly, the invention can be used in the production of semiconductor elements applicable to the CMP process, and can be used over a wide range of applications regardless of product class, such as logic-based or memory-based substrate, or regardless of the type of substrate, such as silicon-based or compound-based substrate.

What is claimed is:

1. A semiconductor device comprising:
a substrate comprising a circuit region, a dummy region, and a dummy clearance section surrounding the circuit region; and
a plurality of dummy patterns formed in the dummy region, the plurality of dummy patterns comprising a first dummy pattern and a second dummy pattern, the first dummy pattern being adjacent the dummy clearance section, the second dummy pattern being adjacent the first dummy pattern, the first dummy pattern being placed between the second dummy pattern and the circuit region such that a distance between the first dummy pattern and the circuit region is less than a distance between the second dummy pattern and the circuit region, and a dummy pattern being absent between the first dummy pattern and the circuit region, wherein the first dummy pattern comprises an area which is greater than an area of the second dummy pattern.

2. The semiconductor device according to claim 1, wherein the first dummy pattern and the second dummy pattern comprise a rectangular shape.

3. The semiconductor device according to claim 1, wherein the circuit region and the dummy clearance section comprise a polygonal shape.

4. The semiconductor device according to claim 1, wherein the plurality of dummy patterns excluding the first and the third dummy patterns are arranged in a row at a first pitch extending in a first direction, and the row is arranged repeatedly at a second pitch in a second direction.

5. The semiconductor device according to claim 1, wherein the first dummy pattern comprises a polygonal shape.

6. A semiconductor device comprising:
a substrate comprising a circuit region, a dummy region and a dummy clearance section surrounding the circuit region, wherein the dummy region comprises a first edge adjacent the dummy clearance section and a second edge distant from the dummy clearance section;
a plurality of a first dummy patterns formed in the dummy region, the plurality of first dummy patterns being disposed along the first edge of the dummy region, and
a plurality of a second dummy patterns formed in the dummy region, the plurality of second dummy patterns being disposed along the second edge of the dummy region,
wherein a first dummy pattern of the plurality of first dummy patterns comprises an area which is greater than an area of a second dummy pattern of the plurality of second dummy patterns.

7. The semiconductor device according to claim 6, wherein the first dummy pattern and the second dummy pattern comprise a rectangular shape.

8. The semiconductor device according to claim 6, wherein the circuit region and the dummy clearance section comprise a polygonal shape.

9. The semiconductor device according to claim 6, wherein the plurality of the second dummy are arranged in a row at a first pitch extending in a first direction, and the row is arranged repeatedly at a second pitch in a second direction.

10. The semiconductor device according to claim 6, wherein the first dummy pattern comprises a polygonal shape.

* * * * *